United States Patent [19]

Ozaki

[11] Patent Number: 4,882,000

[45] Date of Patent: Nov. 21, 1989

[54] METHOD OF MANUFACTURING PRINTED CIRCUIT BOARDS

[75] Inventor: Risuke Ozaki, Kokubunji, Japan

[73] Assignee: O. Key Printed Wiring Co., Ltc., Tokyo, Japan

[21] Appl. No.: 177,896

[22] Filed: Apr. 1, 1988

Related U.S. Application Data

[63] Continuation of Ser. No. 866,352, May 23, 1986, abandoned.

[30] Foreign Application Priority Data

May 23, 1985 [JP] Japan ................................ 60-109308
May 23, 1985 [JP] Japan ................................ 60-109309

[51] Int. Cl.$^4$ .................... B44C 1/16; B32B 31/00; B21D 1/00
[52] U.S. Cl. .................... 156/239; 156/56; 156/247; 156/289; 29/424; 29/852; 427/97
[58] Field of Search ............. 156/52, 55, 56, 87, 156/230, 233, 239, 240, 247, 249, 248, 289, 151, 361; 174/68.5; 29/469, 469.5, 424, 872, 829, 852; 427/97

[56] References Cited

U.S. PATENT DOCUMENTS

| | | | |
|---|---|---|---|
| 3,984,598 | 10/1976 | Sarazin et al. | 156/233 |
| 4,445,952 | 5/1984 | Reynolds, III et al. | 174/68.5 |
| 4,478,884 | 10/1984 | Banes et al. | 427/97 |
| 4,522,667 | 6/1985 | Hanson et al. | 156/87 |
| 4,591,659 | 5/1986 | Leibowitz | 174/68.5 |
| 4,663,208 | 5/1987 | Ninomiya et al. | 29/852 |

OTHER PUBLICATIONS

Scotch ®, "VHB" Joining System; Product Information for Y-4930, Y-4950, 4945, 4965 and Y-9473, Apr., 1983.

*Primary Examiner*—Michael W. Ball
*Assistant Examiner*—Louis Falasco
*Attorney, Agent, or Firm*—Birch, Stewart, Kolasch & Birch

[57] ABSTRACT

The present invention relates to a method of manufacturing printed circuit boards.

The manufacturing method of printed circuit boards under the present invention is to detach a release paper from a metal board on which holes are provided and to which the adhesive sheet and a release paper are attached. Thereafter, the metal board is glued to a resin board having at least one circuit layer and at least either of through holes or lead wire holes, by means of the adhesive sheet by pressing.

An alternative manufacturing method of printed circuit boards under the present invention is to provide lead wire holes at the centers of resin filled holes in a metal board material, and to which an adhesive sheet and a release paper are attached. From the metal board material, a metal board is made by finishing its outer configuration. The release paper is detached from the metal board. Thereafter, the metal board is glued by pressing to a resin board having at least one circuit layer and at least either of through holes or lead wire holes, by means of the adhesive sheet.

1 Claim, 7 Drawing Sheets

METHOD OF MANUFACTURING PRINTED CIRCUIT BOARDS

This application is a continuation of application Ser. No. 866,352 filed on May 23, 1986 now abandoned.

BACKGROUND OF THE INVENTION

1. Field of the Invention

The present invention relates to a method of manufacturing printed circuit boards.

2. Description of the Prior Art

Conventional printed circuit boards at least one circuit layer formed on a resin board. As the miniaturization of electronic system progresses, however, the growing density of components mounted on the printed circuit board increases the heat generated from these mounted components one big problem to be solved is the deteriorating performance of these mounted components that derives from a higher temperature in the adjacent area of the printed circuit board as a result of an insufficient heat releasing capacity of these printed circuit resin boards. To cope with this, components provided with radiation fins had been mounted, but a drawback in this case was a higher cost of mounted components. As the number of mounted components increases, the printed circuit board becomes cambered due to a lesser flexural rigidity of the printed circuit resin board, which makes it impossible to be incorporated into the electronic system. Even if it could be incorporated, it comes in contact with neighboring printed circuit boards and occassionally seriously jeopardizes the circuit function. Moreover, generation of noise cannot be avoided, as the printed circuit resin board has a poor shielding effect.

Therefore, to solve this problem a printed circuit board has been constructed in which a resin board and a metal board are glued together by means of a bonding sheet having at least one circuit layer with through holes formed on the resin board and on the metal board. The centers of the through holes are aligned Also offered in U.S. patent application Ser. No. 691,611 now U.S. Pat. No. 4,663,208 is a printed circuit board in which a resin board and a metal board are glued together by way of a bonding sheet having at least one circuit layer through holes are formed on the resin board and holes which are filled with resin are provided on the metal board. Lead wire holes are drilled at the centers of the resin filled holes and the centers of the through holes and those of the lead wire holes respectively are aligned.

In these printed circuit boards, better heat releasing capacity facilitates a higher density of mounted components since there is no deterioration of the mounted components even though the heat generated from the mounted components is greater, and costly mounted components with radiation fins or else are not necessitated. Also their greater flexural rigidity eliminates any chance of cambering by the printed circuit board even if the number of mounted components increases, so that insertion of the printed circuit board into the electronic system can be easily made, and the inserted printed circuit board does not come into contact with neighboring printed circuit boards. Further, this construction yields a better shielding effect for the prevention of noise. Therefore, it is possible to widely expand the applicable scope of printed circuit boards.

The conventional method of manufacturing such printed circuit boards is hereinafter explained. First, circuit layers, through holes and guide holes are formed on a resin board material. At the same time, holes and guide holes are provided on a metal board material which may be filled with resin lead wire holes are drilled through the centers of the resin filled holes. Next, a number of sets of resin board material and metal board material, with a bonding sheet inserted between, are positioned the heat plates of a multilayer press machine, and by heat-pressing them for 1.5 hours at about 170° .C, the resin board material and the metal board material are glued together by means of the bonding sheet. Then, printed circuit boards are made from the set of the resin board material and the metal board material thus glued together after finishing up their outer configurations.

In this type of manufacturing method, however, when gluing the resin board material and the metal board material together by way of the bonding sheet, it has to employ the multilayer press machine which is very expensive, so that the manufacturing cost becomes higher. Also it takes about two hours for heat-bonding the resin board material and the metal board material together by means of the bonding sheet in the multilayer press machine, so that the longer hours required for manufacture reduces its productivity. Further, to manufacture printed circuit boards wherein a metal board is glued only to a part of the resin board, it requires bonding many metal boards to the resin board material, and in this case the operation of bonding the resin board material and metal boards together by way of an inserted bonding sheet is troublesome and takes much time.

SUMMARY OF THE INVENTION

The objective of the present invention is to offer a low cost method of manufacturing printed circuit boards.

One of other objectives of the present invention is to offer a method of manufacturing printed circuit boards with a high productivity.

Another objective of the present invention is to offer a method of manufacturing printed circuit boards which facilitates manufacture of a printed circuit board wherein a metal board is glued only to a part of a resin board.

The method of manufacturing printed circuit boards under the present invention is characterized by preparing a metal board having holes provided therein with an adhesive sheet and a release paper attached thereto, detaching the release paper from the metal board, and gluing the metal board and a resin board having at least one circuit layer and at least either of the through holes or lead wire holes by means of the adhesive sheet by pressing.

Another method of manufacturing printed circuit boards under the present invention is characterized in preparing a metal board material having holes filled with resin provided therein and an adhesive sheet and a release paper attached thereto, providing lead wire holes at the centers of the resin filled holes, making a metal board from the metal board material through finishing its outer configuration, detaching the release paper from the metal board, and gluing the metal board and a resin board having at least one circuit layer and at least either of through holes or lead wire holes by means of the adhesive sheet by pressing.

In these methods of manufacturing printed circuit boards, the manufacturing cost is extremely low since there is no need for employing a costly multilayer press machine for gluing the resin board and the metal board together, while the productivity improves as it facilitates gluing the resin board and the metal board within a very short time, and further it makes it possible to manufacture with utmost facility printed circuit boards having the metal board glued only to a part of the resin board as metal boards of any desired configuration can be glued to the resin board.

DETAILED DESCRIPTION OF THE INVENTION

Figure 1A:
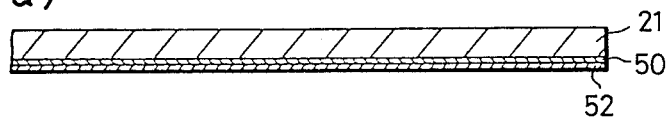
FIGS. 1 through 5 respectively are the explanatory drawings of the manufacturing methods of printed circuit boards under the present invention.
Figure 1B:
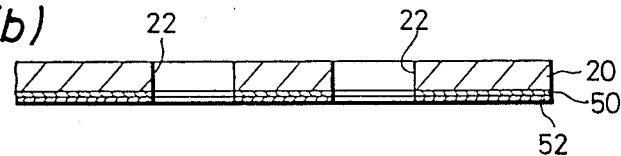
Figure 1C:
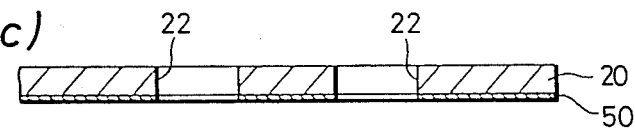
Figure 1D:
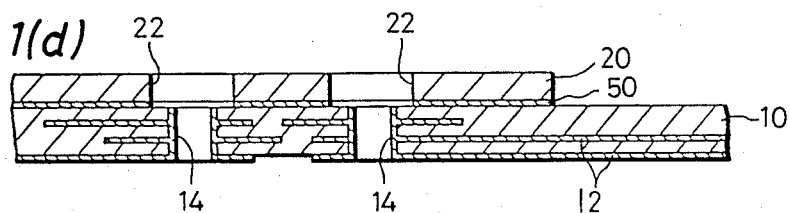
Figure 1E:
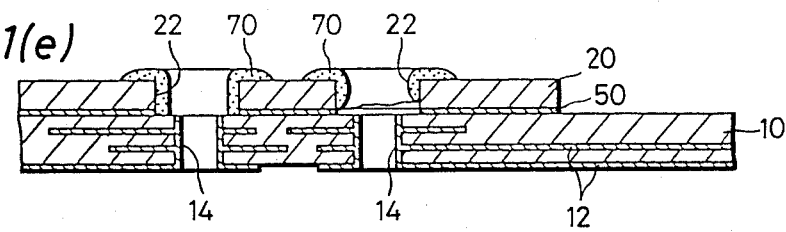
Figure 2A:
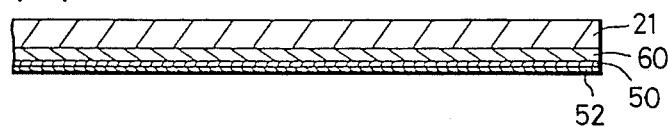
Figure 2B:
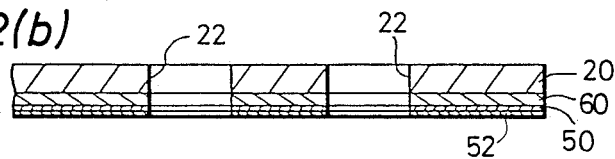
Figure 2C:
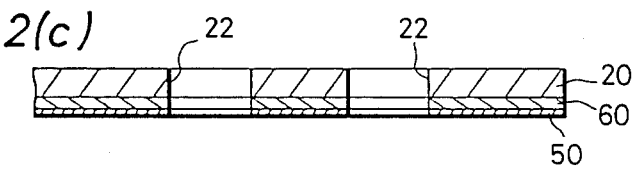
Figure 2D:
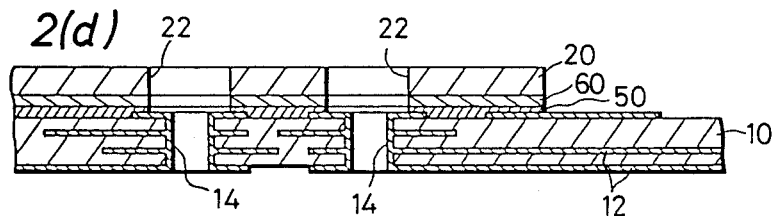
Figure 2E:
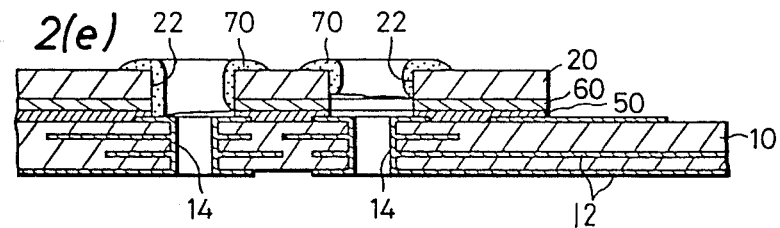
Figure 3A:
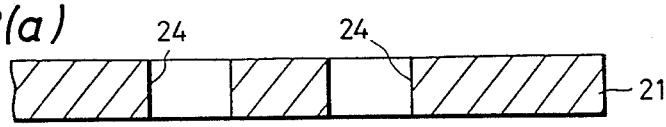
Figure 3B:
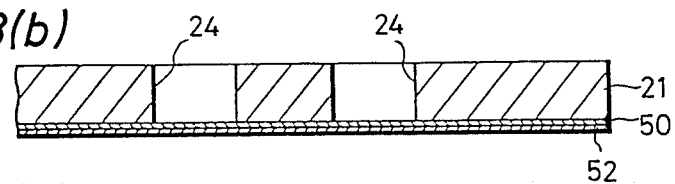
Figure 3C:
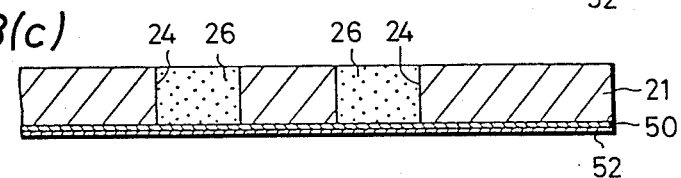
Figure 3D:
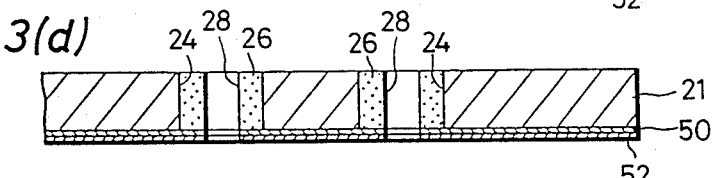
Figure 3E:
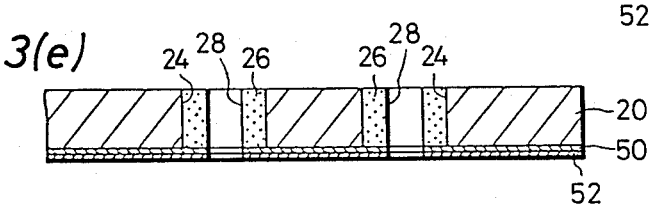
Figure 3F:
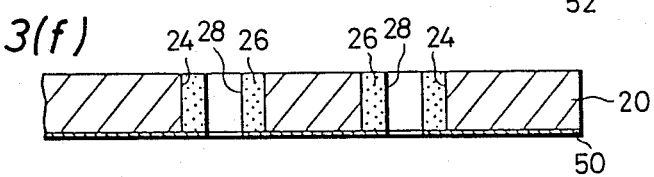
Figure 3G:
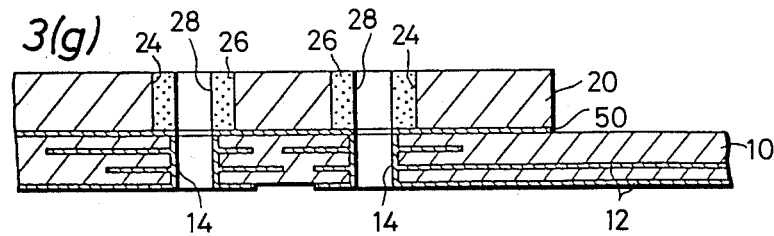
Figure 4A:
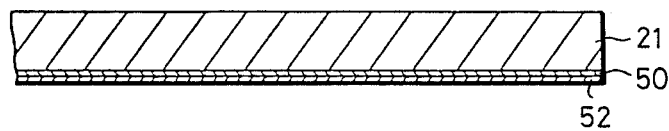
Figure 4B:
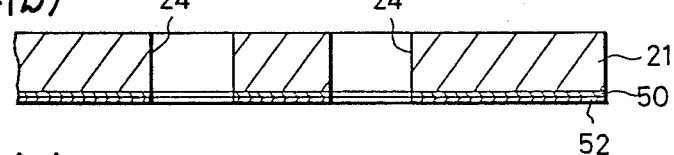
Figure 4C:
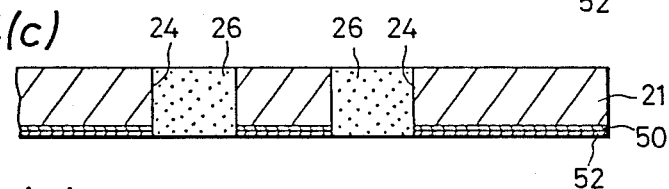
Figure 4D:
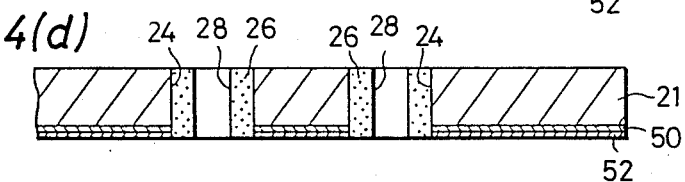
Figure 4E:
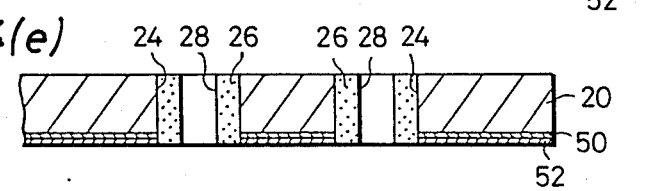
Figure 4F:
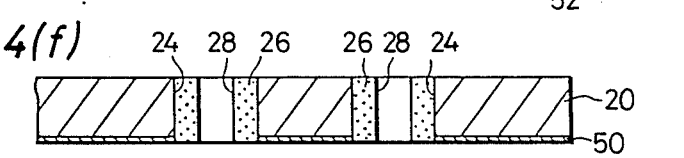
Figure 4G:
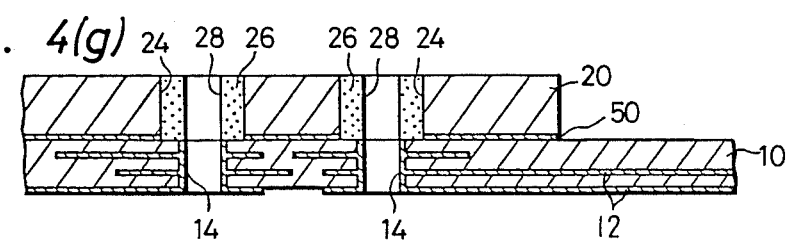
Figure 5A:
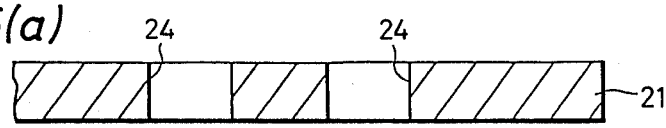
Figure 5B:
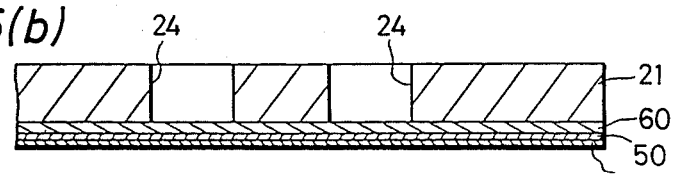
Figure 5C:
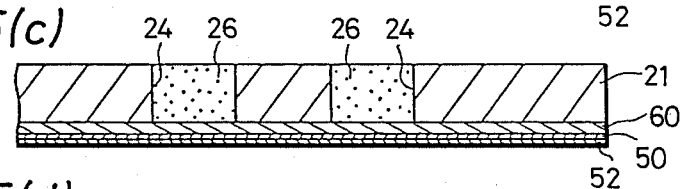
Figure 5D:
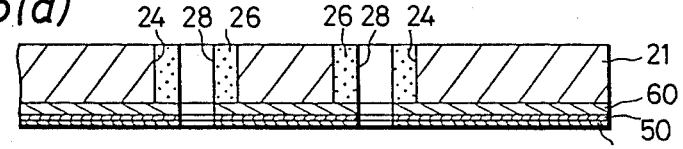
Figure 5E:
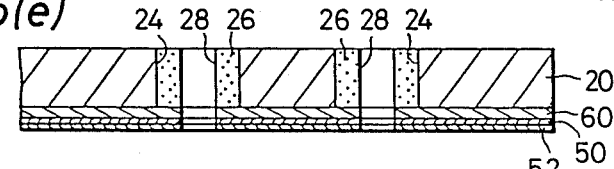
Figure 5F:
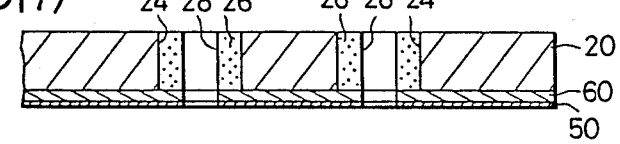
Figure 5G:
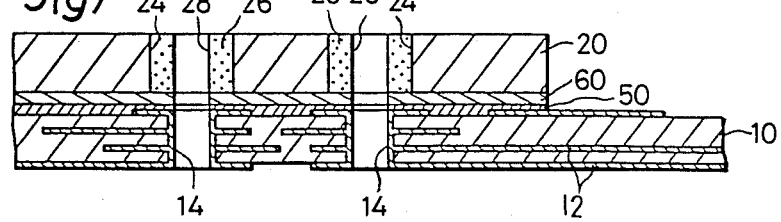
Figure 6:
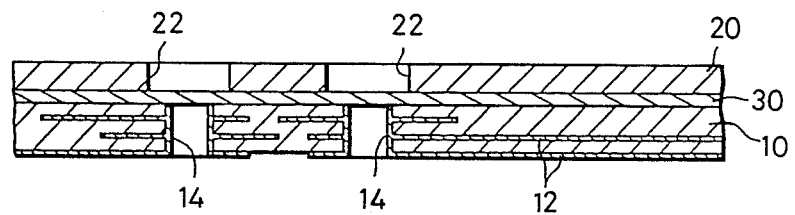
FIGS. 6 and 7 respectively are the sectional views of a part of the printed circuit board.

Explanation of the printed circuit board is made in accordance with FIG. 6. A resin board 10 and a metal board 20 are affixed together by means of a bonding sheet 30, circuit layers 12 and through holes 14 are formed on the resin board 10, holes 22 are provided on the metal board 20, and the center lines of the through holes 14 and those of the holes 22 are aligned.

Figure 7:
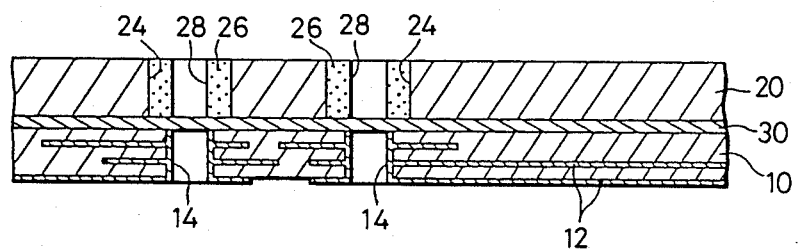
Figure 8A:
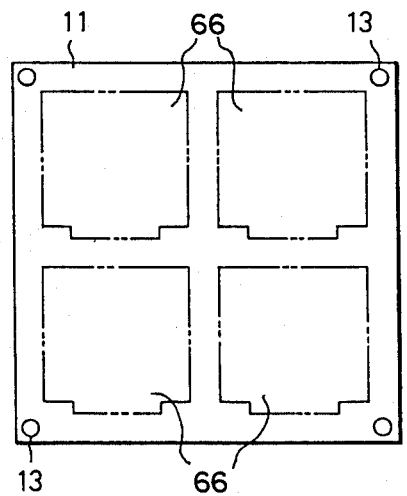
FIG. 8 is the explanatory drawing of the conventional manufacturing method of printed circuit boards.
Figure 8B:
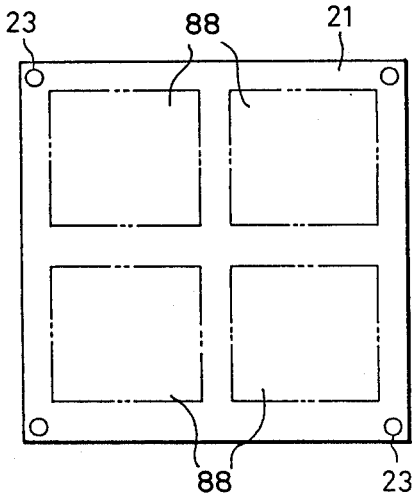
Figure 8C:
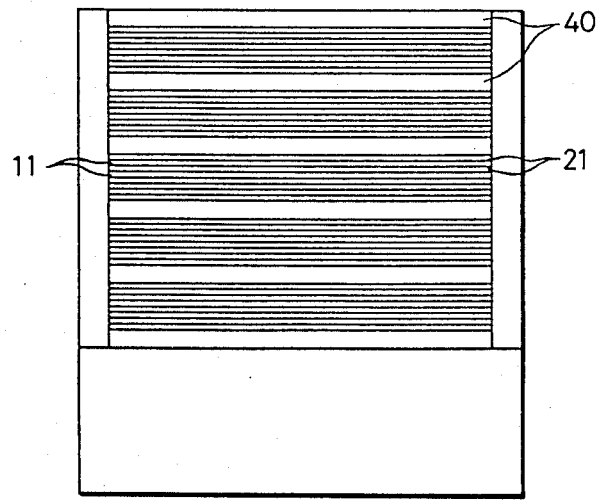
Figure 8D:
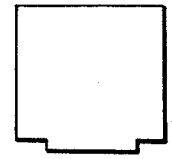

Based on FIG. 7, explanation is made of another type of printed circuit board. A resin board 10 and a metal board 20 are affixed together by means of a bonding sheet 30, circuit layers 12 and through holes 14 are formed on the resin board 10, holes 24 which are filled with resin 26 are opened through the metal board 20, lead wire holes 28 are provided at the centers of the resin 26 filled holes 24, and the center lines of the through holes 14 and those of the lead wire holes 28 are kept aligned.

Next, explanation is made referring to FIG. 8 on the conventional manufacturing method producing printed circuit boards as shown in FIGS. 6 and 7. First, as shown in FIG. 8(a), circuit layers 12 and through holes 14 are prepared on a resin board material 11 within the area indicated by a two-dot line 66, and then guide holes 13 are opened. At the same time, as shown in FIG. 8(b), either holes 22 are provided on a metal board material 21 within the area indicated by a two-dot line 88, further guide holes 23 are provided or holes 24 which are filled with resin are opened on a metal board material 21 within the area indicated by the two-dot line 88. Lead wire holes 28 are provided at the centers of the resin filled holes 24 (not shown), and guide holes 23 are opened. Next, as shown in FIG. 8(c), a number of sets of the resin board material 11 and the metal board material 21 having a bonding sheet 30 inserted in between are positioned between heat plates 40 of a multilayer press machine, and the resin board material 11 and the metal board material 21 are glued together by means of the bonding sheet 30 through heat-pressing at about 170° C. for about 1.5 hours. Then, printed circuit boards as shown in FIG. 8(d) are formed from a set of the resin board material 11 and the metal board material 21 glued together, through outer configurative processing by a press machine, router or otherh appropriate machine.

Based on FIG. 1, explanation is made of the manufacturing method of printed circuit boards under the present invention. First, an adhesive sheet 50 and a release paper 52 are attached to a metal board material 21 (FIG. 1(a)). Next, an NC (numerical control) tape which contains the data for centering the holes 22 is made by NC drawing or a draft film, a press die is made with the use of the NC tape, and a metal board 20 provided with the holes 22 is made from the metal board material 21 by press-processing the metal board material 21 employing aforesaid press die (FIG. 1(b)). Simultaneously with providing the holes 22 the outer configuration of the metal board 20 is finished by a single press processing. Next, the release paper 52 is detached from the metal board 20 (FIG. 1(c)). After providing circuit layers 12 and through holes 14 on a resin board material 11, a resin board 10 is made from the resin board material 11 by outer configurative processing using a press machine, router or other appropriate machine, and then after identifying the position by guide holes (not shown) so as to keep the center lines of both the through holes 14 and the holes 22 aligned, the resin board 10 and the metal board 20 are glued together by means of the adhesive sheet 50 by roller heat-pressing (FIG. 1(d)). Lastly, an insulator 70 is provided around the holes 22 by printing (FIG. 1(e)).

According to FIG. 2, explanation is made of an alternative manufacturing method making printed circuit boards under the present invention. First, an adhesive sheet 50 and a release paper 52 are attached to a metal board material 21 by means of a prepreg 60 (FIG. 2(a)). Next, an NC tape bearing the data for the center positions of holes 22 is prepared, a press die is made with the use of the NC tape, and a metal board 20 having the holes 22 is made from the metal board material 21 by press-processing the metal board material 21 using a press machine with the aforesaid press die (FIG. 2(b)). Next, the release paper 52 is detached from the metal board 20 (FIG. 2(c)). After identifying the position of the respective boards by guide holes (not shown) so as to keep the respective center lines of through holes 14 and the holes 22 aligned, the metal board 20 is glued to a resin board 10 by means of the adhesive sheet 50 by roller heat-pressing (FIG. 2(d)). Finally, an insulator 70 is provided around the hole 22 by printing (FIG. 2(e)).

With FIG. 3, explanation is given on another alternative manufacturing method making printed circuit boards under the present invention. First, an NC tape having the data for the center positions of lead wire holes 28 is prepared by NC drawing or draft film. A metal board material 21 is fixed at a designated position on the NC drilling machine which opens holes in compliance with the data contained on the NC tape, the first drill is mounted on the drilling machine, and holes 24 are opened on the metal board material 21 by the NC drilling machine (FIG. 3(a)). Next, an adhesive sheet 50 and a release paper 52 are attached to the metal board material 21 (FIG. 3(b)). Next, the holes 24 are filled with resin 26 and leveled with squeegee or roller. The resin 26 is then hardened by heat-drying, ultraviolet rays or else other hardening processes (FIG. 3(c)). Next, simultaneously with fixing the metal board material 21 at the designated position on aforesaid NC drilling machine, a second drill having a smaller diameter than the first drill is installed on the drilling machine. Lead wire holes 28 are provided at the centers of the resin filled holes 24 by opening the holes by aforesaid NC drilling machine with the use of the NC tape (FIG. 3(d)). Next, a metal board 20 is made from the metal board material 21 by finishing its outer configuration by a press machine or router (FIG. 3(e)). Next, the release paper 52 is detached from the metal board 20 (FIG. 3(f)). Along with it, a resin board 10 is made from a resin board material 11 through finishing its outer configuration by a press machine or router after providing circuit layers 12 and through holes 14 on the resin board material 11, and also after identifying the position by guide holes (not indicated) so as to have the center lines of both the through holes 14 and the lead wire holes 28 aligned, the metal board 20 is glued to the resin board 10 by way of the adhesive sheet 50 by heat-pressing them together (FIG. 3(g)).

Based on FIG. 4, explanation is made of another alternative manufacturing method of making printed circuit boards related to the present invention. First, an adhesive sheet 50 and a release paper 52 are attached to a metal board material 21 (FIG. 4(a)). Next, an NC tape incorporated with the data for the center positions of lead wire holes 28 is made, the metal board material 21 is fixed at the designated position on an NC drilling machine with which holes are opened according to the directions given by the NC tape, the first drill is mounted on the NC drilling machine, and then holes 24 are opened on the metal board material 21 by the NC drilling machine (FIG. 4(b)). Next, filled into the holes 24 are filed with resin 26 and leveled with squeegee or roller. The resin 26 is thereafter hardened (FIG. 4(c)). Next, while the metal board material 21 is positioned on the NC drilling machine, a second drill having a smaller diameter than the first drill is mounted on the NC drilling machine. The lead wire holes 28 are opened at the centers of the resin filled holes 24 by the NC drilling machine with the use of the NC tape (FIG. 4(d)). Next, a metal board 20 is made from the metal board material 21 by forming its outer configuration by a press machine or router (FIG. 4(e)). Next, the release paper 52 is detached from the metal board 20 (FIG. 4(f)). Then, the metal board 20 is glued to a resin board 10 by means of the adhesive sheet 50 by heat-pressing by roller (FIG. 4(g)).

Explanation is made along with FIG. 5 as to alternative manufacturing method related to the present invention. First, an NC tape having the data for the center positions of lead wire holes 28 is prepared. After fixing a metal board material 21 at the designated position on an NC drilling machine with which holes are bored according to the directions given by the NC tape and mounting the first drill on the NC drilling machine, holes 24 are opened on the metal board material 21 by the NC drilling machine corresponding to the data on the NC tape (FIG. 5(a)). Next, an adhesive sheet 50 and a release paper 52 are attached to the metal board material 21 by means of a prepreg 60 (FIG. 5(b)). Next, the holes 24 are filled with resin 26. The resin 26 is then hardened (FIG. 5(c)). Next, while fixing the metal board material 21 at the designated position on the NC drilling machine and after mounting a second drill having a smaller diameter than the first one to the NC drilling machine, lead wire holes 28 are opened at the centers of the resin filled holes 24 by the NC drilling machine with the use of aforesaid NC tape (FIG. 5(d)). Next, a metal board 20 is made from the metal board material 21 by finishing its outer configuration (FIG. 5(e)). Next, the release paper 52 is taken off from the metal board 20 (FIG. 5(f)). Then, after adjusting the position of the respective boards by guide holes (not shown) so as to place the center lines of both through holes 14 and the lead wire holes 28 on identical lines, the metal board 20 is glued to a resin board 10 by means of the adhesive sheet 50 through heat-pressing by a roller (FIG. 5(g)).

In these manufacturing methods of printed circuit boards, there is no need to glue together the resin board 10 and the metal board 20 by an expensive multilayer press machine as the resin board 10 and the metal board 20 are glued together by means of the adhesive sheet 50 through roller heat-pressing, so that the manufacturing cost becomes very low. Also, roller heat-pressing both the resin board 10 and the metal board 20 facilitates fastening the resin board 10 and the metal board 20 together within a few seconds, so that productivity is much improved. Further, as this makes it possible to glue metal boards 20 of any shape to the resin board 10, a printed circuit board in which a metal board 20 is glued only to a part of the resin board can be manufactured with much facility. Also, in the manufacturing methods explained by FIGS. 3 through 5, since the holes 24 and the lead wire holes 28 are drilled with the use of the same NC tape taking advantage of the identity between the center lines of the resin holes 24 and the lead wire holes 28, the hole drilling operation becomes much easier and facilitates increased accuracy in opening the lead wire holes 28 at the centerse of the holes 24. Furthermore, in the manufacturing methods as explained by FIGS. 2 and 5, even if the metal board 20 is glued to the surface where the circuit layer of the resin board 10 is formed, unwanted conductivity between the circuit layer 12 and the metal board 20 can effectively be prevented by the prepreg 60.

In addition, as for the metal board 20, boards made from any kind of metal, for example, aluminum board, aluminum alloy board, copper board, steel board, etc., can be employed. Also, in above-said manufacturing methods, an NC tape is used as a means for designating hole positions though, other types of hole position designating means can well be used. Further, in the above-said manufacturing methods, although the metal board 20 is glued only to a part of the resin board 10, the present invention can be applied to the case of manufacturing a printed circuit board in which the metal board 20 is glued to the whole surface of the resin board 10. Also, in the abovesaid manufacturing methods, the resin board 10 and the metal board 20 are glued together by roller heat-pressing, but the resin board 10 and the metal board 20 can well be glued together simply by pressing. Further, in the abovementioned manufacturing methods, circuit layers 12 are formed in multilayer on the resin board 10, the circuit layer can easily be formed only one side or both sides of the resin board 10, and in the case where the circuit layer is formed on one side of the resin board 10, lead wire holes can well be formed on the resin board 10. In in the manufacturing methods as explained with FIGS. 2 and 5, though the prepreg 60 is attached to one side of the metal board material 21 and after that the adhesive sheet 50 and the release paper 52 are attached to said surface, the adhesive sheet 50 and the release paper 52 can well be attached to said surface after the insulating layer is formed by printing on one side of the metal board material 21.

It will also be appreciated that, although a number of specific embodiments of the present invention have been detailed for purposes of illustration, various modifications may be made without departing from the spirit and scope of the invention. Accordingly, the invention is not to be limited except by the appended claims.

What is claimed is:

1. A method of manufacturing printed circuit boards which comprises the steps of: preparing a metal board material having holes filled with resin provided therein, attaching an adhesive sheet and a release paper to said metal board material by means of a prepreg, providing lead wire holes at centers of said resin filled said holes, forming a metal board from said metal board material, finishing its outer configuration, detaching said release paper from said metal board, and properly positioning said metal board relative to a resin board having at least one circuit layer and at least either of through holes or lead wire holes, and fastening said metal board and said resin board together by means of said adhesive sheet by pressing without any heat being provided.

* * * * *